(12) United States Patent
Wang et al.

(10) Patent No.: US 11,803,265 B2
(45) Date of Patent: Oct. 31, 2023

(54) TOUCH DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zijian Wang, Beijing (CN); Xu Lu, Beijing (CN); Qing Gong, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 98 days.

(21) Appl. No.: 17/602,583

(22) PCT Filed: Jan. 4, 2021

(86) PCT No.: PCT/CN2021/070129
§ 371 (c)(1),
(2) Date: Oct. 8, 2021

(87) PCT Pub. No.: WO2022/141627
PCT Pub. Date: Jul. 7, 2022

(65) Prior Publication Data
US 2023/0109400 A1 Apr. 6, 2023

(51) Int. Cl.
*G06F 3/041* (2006.01)
*H05K 1/18* (2006.01)

(52) U.S. Cl.
CPC ........... *G06F 3/0412* (2013.01); *H05K 1/189* (2013.01); *H05K 2201/10128* (2013.01)

(58) Field of Classification Search
None
See application file for complete search history.

(56) References Cited

U.S. PATENT DOCUMENTS

| 2016/0306488 | A1  | 10/2016 | Kim et al. |
| 2019/0380197 | A1* | 12/2019 | Lee ........................ H05K 5/0017 |
| 2020/0371627 | A1  | 11/2020 | Luo et al. |

FOREIGN PATENT DOCUMENTS

| CN | 108762562 A   | 11/2018 |
| CN | 211090137 U   | 7/2020  |
| KR | 20150067864 A | 6/2015  |

* cited by examiner

*Primary Examiner* — Brian M Butcher
(74) *Attorney, Agent, or Firm* — IPRO, PLLC

(57) ABSTRACT

This disclosure relates to a touch display device, including a display panel, a main flexible printed circuit and a first bridge flexible printed circuit that are connected to the display panel, wherein a touch component including a touch IC is provided on the first bridge flexible printed circuit. The first bridge flexible printed circuit includes a first bonding area in a bonding connection with the display panel. A first electrode signal line led out of the display panel is connected to the first bridge flexible printed circuit via the first bonding area, and is connected to the touch IC via wiring on the first bridge flexible printed circuit.

11 Claims, 1 Drawing Sheet

TOUCH DISPLAY DEVICE

CROSS-REFERENCE TO RELATED APPLICATION

The present application is a U.S. national phase application of a PCT Application No. PCT/CN2021/070129 filed on Jan. 4, 2021, a disclosure of which is incorporated herein by reference in its entirety.

TECHNICAL FIELD

The present disclosure relates to the field of display product manufacture technologies, in particular to a touch display device.

BACKGROUND

With the rapid development of electronic products, issues such as how to increase battery capacity, how to increase standby time, and how to reduce cost are the focus of manufacturers. The touch IC (TIC) of a conventional flexible multi-layer on cell (FMLOC) screen is disposed on a main flexible printed circuit (MFPC), so a sensing electrode signal line (RX) and a driving electrode signal line (TX) need to be led into the main flexible printed circuit to be connected to the touch IC, which increases the space occupied by the main flexible printed circuit due to the limitation of the wiring rule (e.g., overlapped wiring in adjacent layers is not allowed).

SUMMARY

The technical solution adopted by the present disclosure is: a touch display device, including a display panel, a main flexible printed circuit and a first bridge flexible printed circuit that are connected to the display panel, wherein a touch component including a touch IC is provided on the first bridge flexible printed circuit; the first bridge flexible printed circuit includes a first bonding area bonding the display panel; a first electrode signal line led out of the display panel is connected to the first bridge flexible printed circuit via the first bonding area, and is connected to the touch IC via wiring on the first bridge flexible printed circuit.

Optionally, the first bridge flexible printed circuit is L-shaped, includes a first part and a second part which are arranged intersecting each other, wherein the first bonding area is provided on the first part, and the touch component is arranged on the second part.

Optionally, the second part is provided with a second bonding area for bonding the main flexible printed circuit, and the main flexible printed circuit is provided with a third bonding area for bonding the display panel; and a second electrode signal line led out of the display panel is connected to the main flexible printed circuit via the third bonding area, is connected to the first bridge flexible printed circuit via the second bonding area, and is connected to the touch IC via wiring on the first bridge flexible printed circuit.

Optionally, an end, away from the first part, of the second part is provided with a fourth bonding area for bonding the main flexible printed circuit, and the main flexible printed circuit is provided with a first connector connected to a main circuit board; and a power supply signal line led out of the first connector is connected to the first bridge flexible printed circuit via the fourth bonding area, and is connected to the touch IC via wiring on the first bridge flexible printed circuit.

Optionally, the first connector is located on a side, away from the first part, of the second part.

Optionally, the display panel includes a central display area and a wiring area around the central display area, the wiring area including a first area located on a first side of the central display area in a first direction, the second bonding area and the third bonding area are both arranged in the first area, and the second bonding area and the third bonding area are arranged in a direction perpendicular to the first direction, and the first part of the first bridge flexible printed circuit extends in a direction parallel to the first direction.

Optionally, a distance between the first bonding area and the second bonding area in a direction parallel to the first direction is greater than or equal to 1 mm.

Optionally, the first electrode signal line is a sensing electrode signal line, and the second electrode signal line is a driving electrode signal line.

Optionally, both the main flexible printed circuit and the first bridge flexible printed circuit are a double-layer board.

Optionally, the first bridge flexible printed circuit is U-shaped, and includes a first connection part, and a second connection part and a third connection part which are located at two opposite sides of the first connection part; the touch component is provided on the first connection part, the first bonding area is provided on the second connection part, and the third connection part is provided with a fifth bonding area for bonding the display panel; and a second electrode signal line led out of the display panel is connected to the first bridge flexible printed circuit via the fifth bonding area, and is connected to the touch IC via wiring on the first bridge flexible printed circuit.

Optionally, the main flexible printed circuit is provided with a second connector connected to the main circuit board, and the touch display device further includes a second bridge flexible printed circuit;

an end of the second bridge flexible printed circuit is in a bonding connection with the first connection part of the first bridge flexible printed circuit, and the other end of the second bridge flexible printed circuit is in a bonding connection with the main flexible printed circuit; and a power supply signal line led out of the second connector is in a bonding connection with the first bridge flexible printed circuit via the second bridge flexible printed circuit, and is connected to the touch IC via wiring on the first bridge flexible printed circuit.

Optionally, the second connector is located on a side, away from the second connection part, of the third connection part.

Optionally, the extending direction of the second bridge flexible printed circuit is parallel to the extending direction of the second connection part.

Optionally, the first electrode signal line is the sensing electrode signal line, and the second electrode signal line is the driving electrode signal line.

Optionally, a length of the first bridge flexible printed circuit in the first direction is less than a length of the main flexible printed circuit in the first direction, and a length of the first bridge flexible printed circuit in a second direction intersecting the first direction is less than a length of the main flexible printed circuit in the second direction.

DETAILED DESCRIPTION

Figure 1:
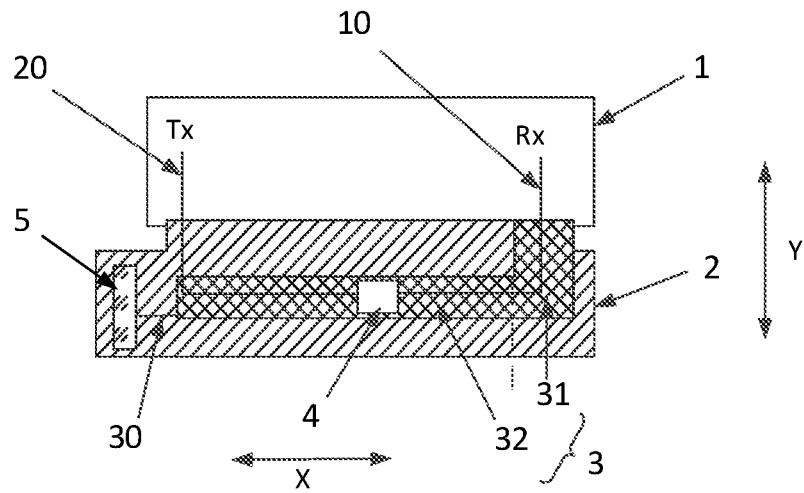
FIG. 1 is a first schematic structural diagram of a touch display device according to an embodiment of the present disclosure.

To further clarify the objects, features and advantages of the embodiments of the present disclosure, a more particular description of the present disclosure will be rendered by reference to specific embodiments thereof which are illustrated in the appended drawings. Obviously, the embodiments described in the present disclosure are part of all embodiments, in which some, but not all, embodiments of the disclosure are shown. Based on the embodiments in the present disclosure, all other embodiments obtained by a person of ordinary skill in the art without creative effort fall within the scope of this disclosure.

In the description of the present disclosure, it should be understood that the orientation or positional relationship indicated by the terms "center", "upper", "lower", "left", "right", "vertical", "horizontal", "inner", "outer", and the like is based on the orientation or positional relationship shown in the drawings, and is merely for convenience of describing the disclosure and simplifying the description, but is not intended to indicate or imply that the referenced device or element must have a particular orientation, be constructed and operated in a particular orientation, and thus these terms should not be construed as limiting the present disclosure. The terms "first", "second" and "third" are used for descriptive purposes only and are not to be construed as indicating or implying relative importance.

In this embodiment, a touch display device is provided. The touch display device includes a display panel 1, and a main flexible printed circuit 2 and a first bridge flexible printed circuit 3 which are connected to the display panel 1, wherein a touch component including a touch IC 4 is provided on the first bridge flexible printed circuit 3, the first bridge flexible printed circuit 3 includes a first bonding area which is in a bonding connection with the display panel 1; a first electrode signal line 10 led out of the display panel 1 is connected to the first bridge flexible printed circuit 3 via the first bonding area and is connected to the touch IC 4 via wiring on the first bridge flexible printed circuit 3.

In the related art, since there are too many wires on the main flexible printed circuit 2, a multi-layer board structure is used. A four-layer board or a six-layer board is generally used. Moreover, subject to limitations of a wiring rule of a driving electrode signal line 20 and a sensing electrode signal line, etc., for example, overlapped wiring in adjacent layers is not allowed, and the sensing electrode signal line Rx 10 and the driving electrode signal line Tx 20 need to be perpendicular to other wires in adjacent layers, instead of parallel to or obliquely crossing the other wires, the cost and the space occupied by wiring of the main flexible printed circuit 2 are increased. Furthermore, each signal line needs to be connected through a via hole, each signal line has a certain width, and the via hole also occupies a certain space, so if a via hole is formed for each signal line, the occupied wiring space will be multiplied, which greatly increases the layout difficulty of the main flexible printed circuit 2 and necessitates an increase of a width of the main flexible printed circuit 2 in a Y-direction.

In the present embodiment, with the arrangement of the first bridge flexible printed circuit 3, the touch IC 4 is arranged on the first bridge flexible printed circuit 3, and the first electrode signal line 10 is directly led into the first bridge flexible printed circuit 3 without passing through the main flexible printed circuit 2, which reduces the space occupied by wiring on the main flexible printed circuit 2, and thus the space occupied by the main flexible printed circuit is reduced.

Since the signal lines on the first bridge flexible printed circuit 3 are simple, the first bridge flexible printed circuit 3 can be provided as a double-layer board, and due to omission of the first electrode signal line 10, interference to the main flexible printed circuit 2 is reduced, the main flexible printed circuit 2 may also be provided as a double-layer board, thereby reducing costs.

In this embodiment, for example, the first electrode signal line is a sensing electrode signal line Rx, but the present disclosure is not limited thereto.

In this embodiment, for example, the first bridge flexible printed circuit 3 is shaped like the character "L", and includes a first part 31 and a second part 32 which are arranged intersecting each other. The first part 31 is provided with the first bonding area, and the touch component is arranged on the second part 32.

In the present embodiment, an angle between the first part and the second part can be set according to actual needs, and in a specific embodiment of the present embodiment, the first part and the second part are arranged perpendicularly to each other, but the present disclosure is not limited thereto.

In this embodiment, for example, the second part 32 is provided with a second bonding area for bonding the main flexible printed circuit 2, and the main flexible printed circuit 2 is provided with a third bonding area for bonding the display panel 1; and a second electrode signal line 20 led out of the display panel 1 is connected to the main flexible printed circuit 2 via the third bonding area, is connected to the first bridge flexible printed circuit 3 via the second bonding area, and is connected to the touch IC 4 via wiring on the first bridge flexible printed circuit 3.

The touch IC 4 is arranged on the first bridge flexible printed circuit 3, and a second electrode signal line 20 needs to be led into the first bridge flexible printed circuit 3 via the main flexible printed circuit 2 so as to be connected to the touch IC 4.

In this embodiment, the second electrode signal line 20 is a driving electrode signal line Tx, but the present disclosure is not limited thereto.

In this embodiment, for example, the second part 32 is provided with a fourth bonding area for bonding the main flexible printed circuit 2, and the main flexible printed circuit 2 is provided with a first connector 5 connected to the main circuit board. A power supply signal line 30 led out of the first connector 5 is connected to the first bridge flexible printed circuit 3 via the fourth bonding area, and is connected to the touch IC 4 via wiring on the first bridge flexible printed circuit 3.

In this embodiment, for example, the first connector 5 is located on a side of the second part 32 that is away from the first part 31. The increase of the space of the main flexible printed circuit 2 in the Y-direction is avoided.

In this embodiment, for example, the first connector 5 is a board to board (B2B, for connecting different circuit boards) connector.

In this embodiment, for example, the display panel 1 includes a central display area and a wiring area around the central display area. The wiring area includes a first area located on a first side of the central display area in a first direction (referring to the Y-direction in FIG. 1). The second bonding area and the third bonding area are both arranged in the first area, and the second bonding area and the third bonding area are arranged in a direction (referring to an X direction in FIG. 1) perpendicular to the first direction. The first part 31 of the first bridge flexible printed circuit 3 extends in a direction parallel to the first direction.

In this embodiment, in order to facilitate wiring, the first part is arranged parallel to the first direction, the second part is arranged perpendicular to the first direction, the first bonding area is arranged at an end of the first part that is away from the second part in the first direction, and the second bonding area is arranged at an end of the second part that is away from the first part in a direction perpendicular to the first direction.

In this embodiment, for example, a distance between the first bonding area and the second bonding area in a direction parallel to the first direction is greater than or equal to 1 mm.

In this embodiment, for example, the connection between the first bridge flexible printed circuit 3 and the display panel 1, the connection between the first bridge flexible printed circuit 3 and the main flexible printed circuit 2, and the connection between the main flexible printed circuit 2 and the display panel 1 can all be implemented by an anisotropic conductive film (ACF), or can be implemented by using solder paste.

In this embodiment, for example, during manufacturing, the first bridge flexible printed circuit 3 and the main flexible printed circuit 2 are bonded to each other first, and then the first bridge flexible printed circuit 3 and the main flexible printed circuit 2 which are bonded together are bonded with the display panel 1 simultaneously.

It should be noted that when the main flexible printed circuit 2 is pressed on the display panel 1, a heat influence zone of a press head may cover the wires of the first bridge flexible printed circuit 3. However, the reflow soldering of components on the flexible printed circuit requires a high temperature of 190 degrees, while the temperature at which the main flexible printed circuit 2 and the display panel 1 are bonded is much less than 190 degrees, thus, there is no influence on the first bridge flexible printed circuit 3. The press head may be designed according to the total width of the main flexible printed circuit 2 and the first bridge flexible printed circuit 3 when the main flexible printed circuit 2 and the first bridge flexible printed circuit 3 are manufactured.

In the present embodiment, for example, the first bridge flexible printed circuit 3 is shaped like the character "U", and includes a first connection part 33, and a second connection part 34 and a third connection part 35 which are located on two opposite sides of the first connection part 33.

The touch component is provided on the first connection part 33, the second connection part 34 is provided with the first bonding area, and the third connection part 35 is provided with a fifth bonding area for bonding the display panel 1; and the second electrode signal line 20 led out of the display panel 1 is connected to the first bridge flexible printed circuit 3 via the fifth bonding area, and is connected to the touch IC 4 via wiring on the first bridge flexible printed circuit 3.

In the present embodiment, the first electrode signal line 10 is a sensing electrode signal line, and the second electrode signal line is a driving electrode signal line, but the present disclosure is not limited thereto.

With the above-mentioned technical solution, both the sensing electrode signal line and the driving electrode signal line are directly led into the first bridge flexible printed circuit 3 without passing through the main flexible printed circuit 2, so that the space occupied by wiring on the main flexible printed circuit 2 is greatly reduced; the main flexible printed circuit 2 can be made very narrow, thereby providing more room for a customer's battery compartment design. In addition, the sensing electrode signal line is connected to the touch IC 4 via wiring on the second connection part 34, and the driving electrode signal line is connected to the touch IC 4 via wiring on the third connection part 35. The sensing electrode signal line and the driving electrode signal line do not overlap and do not interfere with each other. In addition, since both the sensing electrode signal line and the driving electrode signal line are directly led into the first bridge flexible printed circuit 3, the sensing electrode signal line and the driving electrode signal line do not cause interference to other wires on the main flexible printed circuit 2, thus, the wiring difficulty of the main flexible printed circuit 2 is reduced.

In the present embodiment, the display panel 1 includes a central display area and a wiring area around the central display area. The wiring area includes a first area located on a first side of the central display area in a first direction (referring to the Y direction in FIG. 1), the second bonding area and the fifth bonding area are both arranged in the first area, and the second bonding area and the fifth bonding area are arranged in a direction (referring to the X direction in FIG. 1) perpendicular to the first direction. In the first direction, the second bonding area and the fifth bonding area are located at two sides of the bonding area where the main flexible printed circuit 2 is bonded to the first area. The first connection part 33 extends in a direction perpendicular to the first direction; the second connection part 34 and the third connection part 35 are both arranged parallel to the first direction. The first bonding area is arranged at an end of the second connection part 34 that is away from the first connection part 33 in the first direction; and the fifth bonding area is located at an end of the third connection part 35 that is away from the first connection part 33 in the first direction.

In this embodiment, for example, the main flexible printed circuit 2 is provided with the second connector 7 connected to the main circuit board, and the touch display device further includes a second bridge flexible printed circuit 6.

An end of the second bridge flexible printed circuit 6 is in a bonding connection with the first connection part 33 of the first bridge flexible printed circuit 3, and the other end of the second bridge flexible printed circuit 6 is in a bonding connection with the main flexible printed circuit 2. The power supply signal line 30 led out of the second connector 7 is in a bonding connection with the first bridge flexible printed circuit 3 via the second bridge flexible printed circuit 6, and is connected to the touch IC 4 via wiring on the first bridge flexible printed circuit 3.

Figure 2:
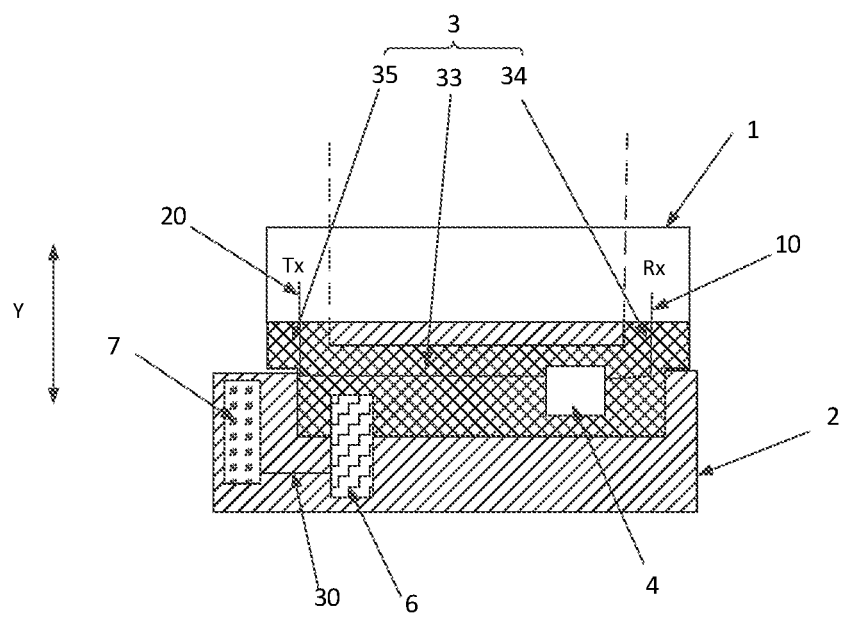
FIG. 2 is a second schematic structural diagram of a touch display device according to an embodiment of the present disclosure.

In this embodiment, the first bridge flexible printed circuit 3 shown in FIG. 1 is L-shaped. The first bridge flexible printed circuit 3 shown in FIG. 2 is U-shaped. In the touch display device shown in FIG. 1, two bonding areas are provided on the main flexible printed circuit 2. One of the bonding areas is used for connecting the driving electrode signal line 20 to the first bridge flexible printed circuit 3, and the other bonding area is used for connecting the power supply signal line 30 to the first bridge flexible printed circuit 3, and the sensing electrode signal line 10 is only directly led into the first bridge flexible printed circuit 3. In the touch display device shown in FIG. 2, the driving electrode signal line 20 and the sensing electrode signal line 10 are directly led into the first bridge flexible printed circuit 3 simultaneously, without passing through the main flexible printed circuit 2, and only one bonding area needs to be provided on the main flexible printed circuit 2 for connecting the second bridge printed circuit. The arrangement in FIG. 2 further reduces the space occupied by wiring on the main flexible printed circuit 2 relative to the arrangement in FIG. 1.

In this embodiment, for example, the second connector 7 is located on a side, away from the second connection part 34, of the third connection part 35.

The second connector 7 is arranged on a side, away from the second connection part 34, of the third connection part 35, so as to prevent the arrangement of the second connector 7 from occupying the space of the main flexible printed circuit 2 in the Y-direction.

In this embodiment, for example, the second connector 7 is a board to board (B2B, for connecting different circuit boards) connector.

In this embodiment, for example, the extending direction of the second bridge flexible printed circuit 6 is parallel to the extending direction of the second connection part 34.

In this embodiment, for example, the length of the first bridge flexible printed circuit 3 in the first direction is less than the length of the main flexible printed circuit 2 in the first direction. The length of the first bridge flexible printed circuit 3 in a second direction intersecting the first direction is less than the length of the main flexible printed circuit 2 in the second direction.

While the foregoing describes optional embodiments of the present disclosure, it will be understood that various improvements and modifications may be made by those skilled in the art without departing from the principle of the present disclosure, and these improvements and modifications shall also be deemed as falling within the scope of the present disclosure.

What is claimed is:

1. A touch display device, comprising a display panel, and a main flexible printed circuit and a first bridge flexible printed circuit that are connected to the display panel, wherein a touch component comprising a touch integrated circuit (IC) is provided on the first bridge flexible printed circuit; the first bridge flexible printed circuit comprises a first bonding area in a bonding connection with the display panel; a first electrode signal line led out of the display panel is connected to the first bridge flexible printed circuit via the first bonding area, and is connected to the touch IC via wiring on the first bridge flexible printed circuit;
   wherein the first bridge flexible printed circuit is L-shaped, comprises a first part and a second part which are arranged intersecting each other, the first bonding area is provided on the first part, and the touch component is arranged on the second part; wherein the second part is provided with a second bonding area for bonding the main flexible printed circuit, and the main flexible printed circuit is provided with a third bonding area for bonding the display panel, and a second electrode signal line led out of the display panel is connected to the main flexible printed circuit via the third bonding area, is connected to the first bridge flexible printed circuit via the second bonding area, and is connected to the touch IC via wiring on the first bridge flexible printed circuit;
   or,
   wherein the first bridge flexible printed circuit is U-shaped, and comprises a first connection part, and a second connection part and a third connection part which are located at two opposite sides of the first connection part; and
   the touch component is provided on the first connection part, the first bonding area is provided on the second connection part, and the third connection part is pro-
vided with a fifth bonding area for bonding the display panel; and a second electrode signal line led out of the display panel is connected to the first bridge flexible printed circuit via the fifth bonding area, and is connected to the touch IC via wiring on the first bridge flexible printed circuit.

2. The touch display device according to claim 1, wherein an end, away from the first part, of the second part is provided with a fourth bonding area for bonding the main flexible printed circuit, and the main flexible printed circuit is provided with a first connector connected to a main circuit board; a power supply signal line led out of the first connector is connected to the first bridge flexible printed circuit via the fourth bonding area, and is connected to the touch IC via wiring on the first bridge flexible printed circuit.

3. The touch display device according to claim 2, wherein the first connector is located on a side, away from the first part, of the second part.

4. The touch display device according to claim 3, wherein the display panel comprises a central display area and a wiring area around the central display area, the wiring area comprises a first area located on a first side of the central display area in a first direction, the second bonding area and the third bonding area are both arranged in the first area, and the second bonding area and the third bonding area are arranged in a direction perpendicular to the first direction, and the first part of the first bridge flexible printed circuit extends in a direction parallel to the first direction.

5. The touch display device according to claim 4, wherein a distance between the first bonding area and the second bonding area in a direction parallel to the first direction is greater than or equal to 1 mm.

6. The touch display device according to claim 1, wherein the first electrode signal line is a sensing electrode signal line, and the second electrode signal line is a driving electrode signal line.

7. The touch display device according to claim 1, wherein both the main flexible printed circuit and the first bridge flexible printed circuit are a double-layer board.

8. The touch display device according to claim 1, wherein the main flexible printed circuit is provided with a second connector connected to the main circuit board, and the touch display device further comprises a second bridge flexible printed circuit; and
   an end of the second bridge flexible printed circuit is in a bonding connection with the first connection part of the first bridge flexible printed circuit, and an other end of the second bridge flexible printed circuit is in a bonding connection with the main flexible printed circuit; and a power supply signal line led out of the second connector is in a bonding connection with the first bridge flexible printed circuit via the second bridge flexible printed circuit, and is connected to the touch IC via wiring on the first bridge flexible printed circuit.

9. The touch display device according to claim 8, wherein the second connector is located on a side, away from the second connection part, of the third connection part.

10. The touch display device according to claim 8, wherein an extending direction of the second bridge flexible printed circuit is parallel to an extending direction of the second connection part.

11. The touch display device according to claim 1, wherein a length of the first bridge flexible printed circuit in a first direction is less than a length of the main flexible printed circuit in the first direction, and a length of the first bridge flexible printed circuit in a second direction intersecting the first direction is less than a length of the main flexible printed circuit in the second direction.

* * * * *